(12) United States Patent
Machida et al.

(10) Patent No.: US 7,045,457 B2
(45) Date of Patent: May 16, 2006

(54) FILM FORMING MATERIAL, FILM FORMING METHOD, AND SILICIDE FILM

(75) Inventors: Hideaki Machida, Yamanashi (JP); Yoshio Ohshita, Aichi (JP); Masato Ishikawa, Yamanashi (JP); Takeshi Kada, Yamanashi (JP)

(73) Assignee: Tri Chemical Laboratores Inc., Kitatsuru-Gun (JP)

( * ) Notice: Subject to any disclaimer, the term of this patent is extended or adjusted under 35 U.S.C. 154(b) by 2 days.

(21) Appl. No.: 10/895,871

(22) Filed: Jul. 22, 2004

(65) Prior Publication Data

US 2005/0059243 A1    Mar. 17, 2005

(30) Foreign Application Priority Data

Sep. 17, 2003   (JP) .............................. 2003-325165

(51) Int. Cl.
*H01L 21/4763*    (2006.01)
(52) U.S. Cl. ...................... 438/649; 438/651; 438/655; 438/664; 438/681; 438/682
(58) Field of Classification Search ................ 438/649, 438/651, 655, 664, 681–682
See application file for complete search history.

(56) References Cited

U.S. PATENT DOCUMENTS

| | | | |
|---|---|---|---|
| 4,507,401 A * | 3/1985 | Dubois et al. | 502/242 |
| 4,992,305 A * | 2/1991 | Erbil | 427/252 |
| 6,753,245 B1 * | 6/2004 | Choi | 438/613 |
| 6,777,565 B1 * | 8/2004 | Choi | 556/9 |
| 2002/0015789 A1 * | 2/2002 | Choi | 427/255.28 |
| 2003/0073860 A1 * | 4/2003 | Choi | 556/10 |
| 2004/0197470 A1 * | 10/2004 | Choi | 427/226 |
| 2004/0219369 A1 * | 11/2004 | Garg et al. | 428/446 |

FOREIGN PATENT DOCUMENTS

JP        06-204173        7/1994

* cited by examiner

*Primary Examiner*—Lynne A. Gurley
(74) *Attorney, Agent, or Firm*—Oblon, Spivak, McClelland, Maier & Neustadt, P.C.

(57) ABSTRACT

A technique is provided of forming silicide films usable for next-generation transistors through a CVD process. In the technique of forming a silicide film formed of Ni and Si, where one or more chemical compounds represented with the following general formula [I] are used as an Ni source:

General formula [I]

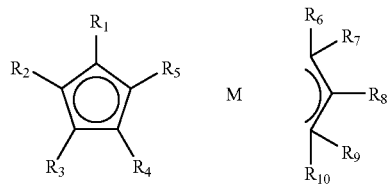

where $R_1$, $R_2$, $R_3$, $R_4$, $R_5$, $R_6$, $R_7$, $R_8$, $R_9$, or $R_{10}$ is H or a hydrocarbon group.

12 Claims, 1 Drawing Sheet

FILM FORMING MATERIAL, FILM FORMING METHOD, AND SILICIDE FILM

BACKGROUND OF THE INVENTION

The present invention relates to a material for forming, for example, semiconductor wiring films, to a film forming method, and to films.

Recently, the progress in the semiconductor field is remarkable. For example, LSIs are being shifted toward ULSIs. Miniaturization is being developed to improve the signal processing speed. Copper having a low resistance is selected as wiring conductor materials and the spacing between wiring conductors is filled with a material having a very low dielectric constant. There is a demand for thinning films of those materials. Moreover, it has been studied that the gate oxide film is formed of a metal oxide film such as $HfO_2$.

Even if the above-mentioned technical idea is adopted, the micro-patterning leads to extremely shallow diffusion layers at the source-drain regions, and thus increases the resistance components thereof. Therefore, it is difficult to improve the signal processing speed.

Not only the contact at the source-drain region but also the resistance of the gate electrode have been perceived as problems. For that reason, it has been long wanted to develop new materials.

In order to overcome such problems, metal silicides such as $TiSi_2$ or $CoSi_2$ have been studied (refer to Japanese Patent Laid-open Publication No. H6-204173).

However, it is predicted that $TiSi_2$ or $CoSi_2$ has a limit to gain the performance in future.

In view of such a limitation, the present inventor et al. consider that NiSi must be introduced for the future semiconductor elements.

It was considered that the NiSi thin film can be easily produced using the sputtering technique.

However, the sputtering physically damages the semiconductor elements. Moreover, NiSi may react with Si, being a base substrate, at high temperatures to make $NiSi_2$. This results in poor film uniformity.

Accordingly, it was found that it is not preferable to form a NiSi film through sputtering.

SUMMARY OF THE INVENTION

For that reason, it has been waited that the technique of forming NiSi films at low temperatures through the chemical vapor deposition (CVD) process.

The problem to be solved by the present invention is to provide the technique of forming silicide films such as NiSi films by the CVD process.

In the course of going zealously with the research to solve the above-mentioned problems, the present inventor et al. noticed that it is very important to specify a suitable material as a silicide forming material. As a result of continuing the study based on the knowledge, it has found that the chemical compounds represented with the following formula are very preferable as a Ni source.

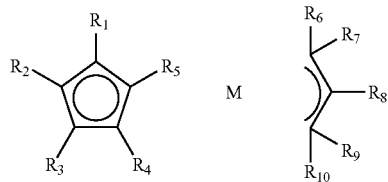

Moreover, it has been found that using chemical compounds represented with $Si_xH_{(2x+2)}$ or $R_xSiH_{(4-x)}$ as a Si source results in a more preferable silicide film.

The present invention was achieved based on the knowledge.

The present invention relates to a method for forming an NiSi (silicide) film, wherein one or more chemical compounds represented with the following general formula [I] are used as an Ni source.

Particularly, the present invention relates to a method for forming an NiSi (silicide) film by a chemical vapor deposition process, wherein one or more chemical compounds represented with the following general formula [I] are used as an Ni source.

That is, the NiSi (silicide) film is formed by a chemical vapor deposition process, in which both Ni compound and Si compound, the Ni compound being represented with the general formula [I], are decomposed.

The present invention relates to a silicide film formed by a chemical vapor deposition process in which Ni compounds and Si compounds are decomposed, wherein the Ni compound is one or more chemical compounds represented with the following general formula [I].

Moreover, the present invention relates to a film forming material for forming an NiSi (silicide) film, wherein an Ni source is one or more chemical compounds represented with the following general formula [I]:

General formula [I]

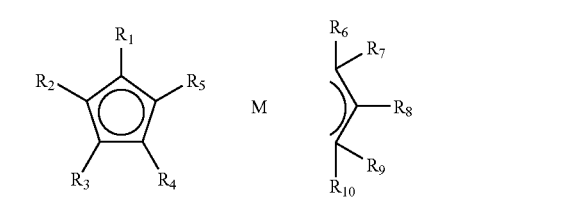

(where $R_1$, $R_2$, $R_3$, $R_4$, $R_5$, $R_6$, $R_7$, $R_8$, $R_9$, or $R_{10}$ is H or a hydrocarbon group and is of the same type or a different type, and M=Ni).

In the film forming material, a hydrocarbon group of $R_1$, $R_2$, $R_3$, $R_4$, $R_5$, $R_6$, $R_7$, $R_8$, $R_9$, or $R_{10}$ in the general formula [I] is preferably an alkyl group and particularly, an alkyl group having a carbon number of 1 to 12. Particularly, cyclopentadienylallyl nickel, methylcyclopentadienylallyl nickel, ethylcyclopentadienylallyl nickel, isopropylcyclopentadienylallyl nickel, and n-butylcyclopentadienylallyl nickel are listed as preferable chemical compounds.

The Si compound is used to form the silicide film. One or more chemical compounds selected from the group consisting of $Si_xH_{(2x+2)}$ (where x is an integer of 1 or more), and $R_xSiH_{(4-x)}$ (where R is a hydrocarbon group and x is an integer of 0 to 3, and when there are two or more hydrocarbon groups R(Rs), all Rs are of the same type or a different type) is used for the Si compound. Particularly, $SiH_4$, $Si_2H_6$, and $Si_3H_8$ are preferable for the Si compound.

Particularly, a reducing agent, preferably, hydrogen is used to form the silicide film.

In order to form the silicide film, the Ni source (the Ni compound) and the Si source (the Si compound) are decomposed at the same time or separately. Preferably, those chemical compounds are decomposed at the same time. For example, heat, plasma, light and laser are used as the decomposition means.

A conductive silicide film is formed using the above-mentioned film forming method. Particularly, the silicide film is formed, for example, in semiconductor elements such as MOSFETs.

Moreover, the present invention provides silicide films containing Ni and Si, formed by the above-mentioned film forming process. Moreover, the present invention provides elements (for example, MOSFETs) to which the silicide film is embodied.

The semiconductor elements having NiSi (silicide) films, where the above-mentioned chemical compounds are used, have higher performances than semiconductor elements having metal silicide films such as $TiSi_2$ or $CoSi_2$.

Particularly, there is not fear that the semiconductor element having silicide films, which are formed with the above-mentioned chemical compounds through the CVD process, may be physically damaged as caused by the sputtering process. Moreover, there is no fear that $NiSi_2$ is formed through the chemical reaction with Si of the base substrate. Moreover, the present invention provides good film uniformity.

BRIEF DESCRIPTION OF DRAWINGS

This and other objects, features and advantages of the present invention will become more apparent upon a reading of the following detailed description and drawings, in which.

DESCRIPTION OF THE EMBODIMENTS

Figure 1:
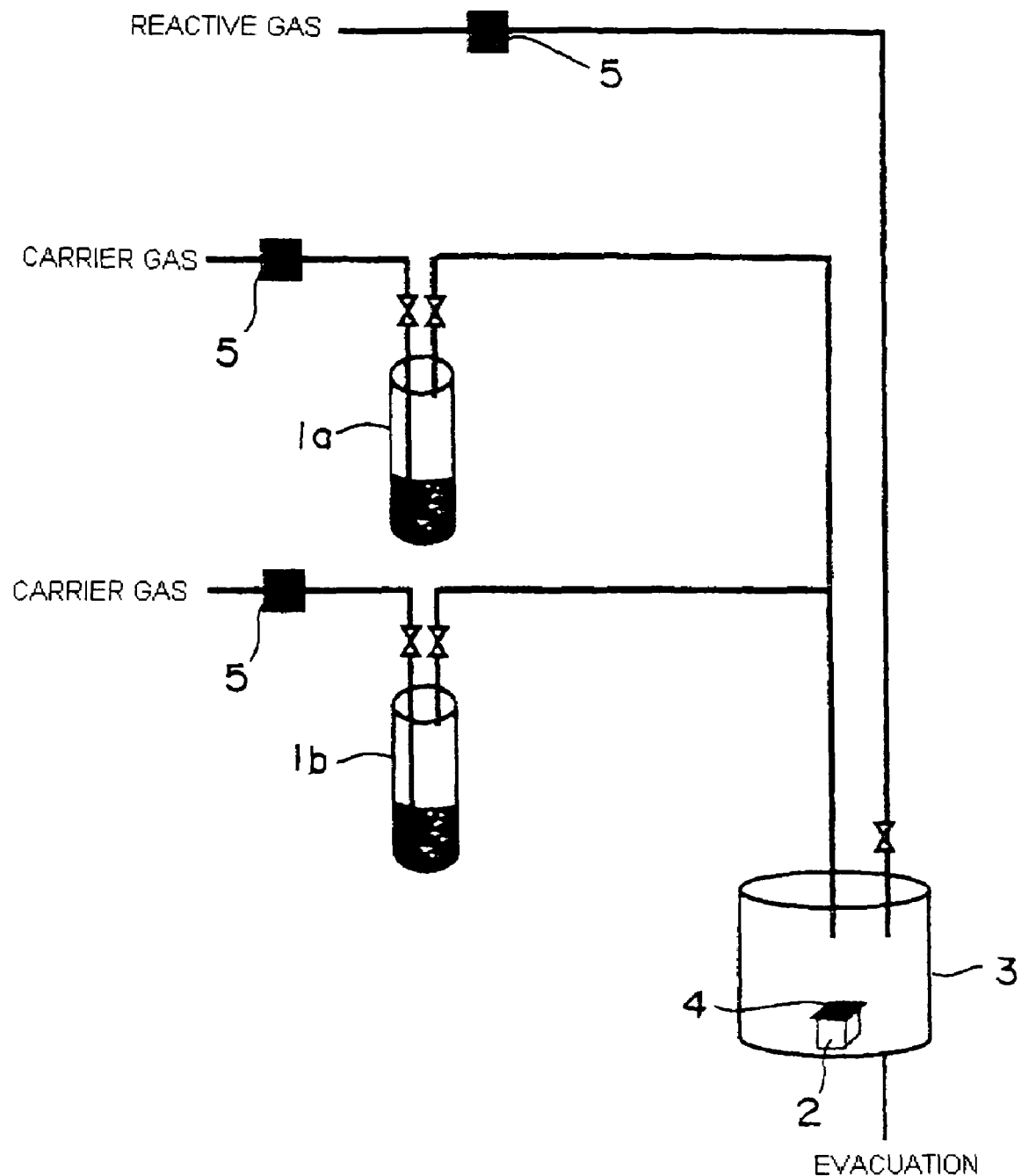
FIG. 1 is a schematic diagram illustrating a CVD apparatus.

The film forming method according to the present invention relates to a method for forming NiSi (silicide) films. Particularly, the present invention relates to a method for forming NiSi (silicide) films by the CVD process or for forming conductive silicide films. The present invention relates to a method for forming NiSi (silicide) films in semiconductor elements such as MOSFETs. One or more chemical compounds represented with the previous general formulas [I] are used as an Ni source for NiSi (silicide) films.

The film related to the presented invention is a NiSi (silicide) film, particularly, a NiSi (silicide) film or a conductive silicide film, created by the CVD process. In more detail, the film of the present invention relates to a NiSi (silicide) film formed for semiconductor elements such as MOSFETs. One or more chemical compounds represented with the previous general formulas [I] are used as a Ni source for the NiSi (silicide) film.

The film forming material of the present invention is the material forming a NiSi (silicide) film. Particularly, the film forming material is the material for forming a NiSi (silicide) film by the CVD process or for forming a conductive silicide film. In more detail, the film forming material is the material for forming a NiSi (silicide) film for the semiconductor elements such as MOSFETs. The film forming material comprises at least one or more chemical compounds represented with the previous general formulas [I].

A hydrocarbon group of $R_1$, $R_2$, $R_3$, $R_4$, $R_5$, $R_6$, $R_7$, $R_8$, $R_9$, or $R_{10}$ in the general formula [I] is, particularly, an alkyl group. The hydrocarbon group is an alkyl group having a carbon number of 1 to 12 and, more particularly, is an alkyl group having a carbon number of 1 to 6. A hydrocarbon group of $R_1$, $R_2$, $R_3$, $R_4$, or $R_5$ is, an alkyl group having a carbon number of 1 to 4. A hydrocarbon group of $R_6$, $R_7$, $R_8$, $R_9$, or $R_{10}$ is, an alkyl group having a carbon number of 1 to 6. Such alkyl groups are particularly preferable because a moderate vapor pressure can be easily obtained in the CVD process.

Particularly preferable chemical compounds of the Ni compounds will be listed up below. For example, as the Ni compound are listed cyclopentadienylallyl nickel, methylcyclopentadienylallyl nickel, ethylcyclopentadienylallyl nickel, isopropylcyclopentadienylallyl nickel, and n-butylcyclopentadienylallyl nickel.

Si compound is used to form the silicide film. In order to form the silicide film, $Si_xH_{(2x+2)}$ (where x is an integer of 1 or more), or $R_xSiH_{(4-x)}$ (where R is a hydrocarbon group (preferably, an alkyl group or an alkyl group having a carbon number of 1 to 12) and x is an integer of 0 to 3, and when there are two or more Rs, all Rs are of the same type or a different type) are used.

Particularly, of the Si compounds, $SiH_4$, $Si_2H_6$, and $Si_3H_8$, for example, are preferable.

Particularly, a reducing agent, for example, hydrogen is used to form the silicide film.

In the formation of the silicide film, the Ni source (the Ni compound) and the Si source (the Si compound) are decomposed simultaneously or separately. Particularly, both the sources are decomposed simultaneously. For example, heat, plasma, light, laser, and the equivalents are used as the decomposition means.

The conductive silicide film is formed as described above. For example, a silicide film is formed for semiconductor elements (e.g. MOSFETs) having the silicide films.

The embodiment will be described below in detail.

Embodiment 1

FIG. 1 is a schematic diagram illustrating a chemical vapor deposition (CVD) apparatus. Referring to FIG. 1, numeral 1*a*, 1*b* represents a raw material container, 2 represents a heater, 3 represents a decomposition reactor, 4 represents a Si substrate, and 5 represents a gas flow controller.

The container 1*a* held cyclopentadienylallyl nickel $[C_5H_5NiC_3H]$. This Ni compound was heated at 30° C. Argon gas was blown in as carrier gas at a rate of 30 ml/min. The vaporized $C_5H_5NiC_3H_5$ was introduced into the decomposition reactor 3, together with the carrier gas. At this time, the inside of the system was evacuated to 1 to 500 Torr. The substrate 4 was heated at 250° C.

When $C_5H_5NiC_3H_5$ was introduced into the decomposition reactor 3, $Si_3H_8$ diluted to 1% with hydrogen (a reducing agent) was introduced into the decomposition reactor 3 at a rate of 20 ml/min.

Thus, the film was formed on the substrate 4.

The resultant film was examined by the X-ray photoelectron spectroscopy (XPS). As a result, the existence of Ni and Si was found. Moreover, in the examination with the X-ray (XRD), it was ascertained that the film is a NiSi film. Moreover, under the cross section TEM (transmission electron microscope), the interface between the base substrate Si and the NiSi film was very flat. Moreover, it was found that no reaction arises in the interface (Si).

Therefore, the NiSi film is preferable to the next generation semiconductor elements.

In contrast, a NiSi film was formed through the sputtering process, as shown in the conventional practice. In this case, a large number of pyramid-like $NiSi_2$ invading the base substrate were observed. The interface was not flat.

Embodiment 2

In the embodiment 1, a similar process was carried out using methylcyclopentadienylallyl nickel [$(CH_3)C_5H_4NiC_3H_5$], instead of $C_5H_5NiC_3H_5$. A film was formed on the substrate 4.

This film was examined using the XPS. As a result, the existence of Ni and Si was found. When the film was examined using the XRD, it was found that the film is a NiSi film. According to the cross-section TEM, the interface between the base substrate Si and the NiSi film was very flat. Moreover, it was found that there is no reaction in the interface (Si).

Therefore, the NiSi film is preferable to the next generation semiconductor elements.

Embodiment 3

In the embodiment 1, a similar process was carried out using ethylcyclopentadienylallyl nickel [$(C_2H_5)C_5H_4NiC_3H_5$], instead of $C_5H_5NiC_3H$. A film was formed on the substrate 4.

The film was examined using the XPS. As a result, the existence of Ni and Si was found. When the film was examined using the XRD, it was found that the film is a NiSi film. Under the cross-sectional TEM, the interface between the base substrate Si and the NiSi film was very flat. It was found that there is no reaction in the interface (Si).

Therefore, the NiSi film is preferable to the next generation semiconductor elements.

Embodiment 4

In the embodiment 1, a similar process was carried out using isopropylcyclopentadienylallyl nickel [$i-C_3H_7C_5H_4NiC_3H_5$], instead of $C_5H_5NiC_3H_5$. A film was formed on the substrate 4.

The film was examined using the XPS. As a result, the existence of Ni and Si was found. When the film was examined using the XRD, it was found that the film is a NiSi film. Under the cross-sectional TEM, the interface between the base substrate Si and the NiSi film was very flat. It was found that there is no reaction in the interface (Si).

Therefore, the NiSi film is preferable to the next generation semiconductor elements.

Embodiment 5

In the embodiment 1, a similar process was carried out using n-butylcyclopentadienylallyl nickel [$(n-C_4H_9)C_5H_4NiC_3H_5$], instead of $C_5H_5NiC_3H_5$. A film was formed on the substrate 4.

The film was examined using the XPS. As a result, the existence of Ni and Si was found. When the film was examined using the XRD, it was found that the film is a NiSi film. Under the cross-sectional TEM, the interface between the base substrate Si and the NiSi film was very flat. It was found that there is no reaction in the interface (Si).

Therefore, the NiSi film is preferable to the next generation semiconductor elements.

Embodiments 6 and 7

In the embodiment 1, a similar process was carried out using $SiH_4$ or $Si_2H_6$, instead of $Si_3H_8$. A film was formed on the substrate 4.

The film was examined using the XPS. As a result, the existence of Ni and Si was found. When the film was examined using the XRD, it was found that the film is a NiSi film. Under the cross-sectional TEM, the interface between the base substrate Si and the NiSi film was very flat. It was found that there is no reaction in the interface (Si).

Therefore, the NiSi film is preferable to the next generation semiconductor elements.

Embodiments 8 and 9

In the embodiment 2, a similar process was carried out using $SiH_4$ or $Si_2H_6$, instead of $Si_3H_8$. A film was formed on the substrate 4.

The film was examined using the XPS. As a result, the existence of Ni and Si was found. When the film was examined using the XRD, it was found that the film is a NiSi film. Under the cross-sectional TEM, the interface between the base substrate Si and the NiSi film was very flat. It was found that there is no reaction in the interface (Si)

Therefore, the NiSi film is preferable to the next generation semiconductor elements.

Embodiments 10 and 11

In the embodiment 3, a similar process was carried out using $SiH_4$ or $Si_2H_6$, instead of $Si_3H_8$. A film was formed on the substrate 4.

The film was examined using the XPS. As a result, the existence of Ni and Si was found. When the film was examined using the XRD, it was found that the film is a NiSi film. Under the cross-sectional TEM, the interface between the base substrate Si and the NiSi film was very flat. It was found that there is no reaction in the interface (Si).

Therefore, the NiSi film is preferable to the next generation semiconductor elements.

Embodiments 12 and 13:

In the embodiment 4, a similar process was carried out using $SiH_4$ or $Si_2H_6$, instead of $Si_3H_8$. A film was formed on the substrate 4.

The film was examined using the XPS. As a result, the existence of Ni and Si was found. When the film was examined using the XRD, it was found that the film is a NiSi film. Under the cross-sectional TEM, the interface between the base substrate Si and the NiSi film was very flat. It was found that there is no reaction in the interface (Si).

Therefore, the NiSi film is preferable to the next generation semiconductor elements.

Embodiments 14 and 15

In the embodiment 5, a similar process was carried out using $SiH_4$ or $Si_2H_6$, instead of $Si_3H_8$. A film was formed on the substrate 4.

The film was examined using the XPS. As a result, the existence of Ni and Si was found. When the film was examined using the XRD, it was found that the film is a NiSi film. Under the cross-sectional TEM, the interface between the base substrate Si and the NiSi film was very flat. It was found that there is no reaction in the interface (Si).

Therefore, the NiSi film is preferable to the next generation semiconductor elements.

Embodiments 16, 17, and 18:

In the embodiment 1, the compound decomposition was carried out through irradiating plasma, light, or laser, instead of heating. Thus, a film was formed on the substrate 4.

The film was examined using the XPS. As a result, the existence of Ni and Si was found. When the film was examined using the XRD, it was found that the film is a NiSi film. Under the cross-sectional TEM, the interface between the base substrate Si and the NiSi film was very flat. It was found that there is no reaction in the interface (Si).

Therefore, the NiSi film is preferable to the next generation semiconductor elements.

The present invention is particularly useful in the field of semiconductors.

What is claimed is:

1. A method for forming an NiSi film, comprising:
    decomposing an Ni compound of Formula (I) in the presence of a silane compound to form the NiSi film,

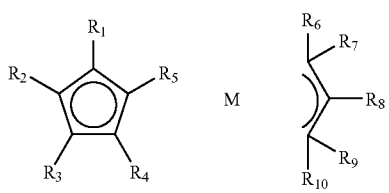

(I)

wherein $R_1$, $R_2$, $R_3$, $R_4$, $R_5$, $R_6$, $R_7$, $R_8$, $R_9$ and $R_{10}$ are, independently, at least one of a H atom or a hydrocarbon group, and M=Ni.

2. The method of claim 1, wherein the Ni compound and the silane compound are decomposed during chemical vapor deposition.

3. The method of claim 1, wherein any one of $R_1$, $R_2$, $R_3$, $R_4$, $R_5$, $R_7$, $R_8$, $R_9$, or $R_{10}$ is an alkyl group.

4. The method of claim 1, wherein each of $R_1$–$R_{10}$ is an alkyl group.

5. The method of claim 1, wherein the Ni compound is at least one compound selected from the group consisting of cyclopentadienylallyl nickel, methylcyclopentadienylallyl nickel, ethylcyclopentadienylallyl nickel, isopropylcyclopentadienylallyl nickel, and n-butylcyclopentadienylallyl nickel.

6. The method of claim 1, wherein the silane compound is at least one selected from the group consisting of a compound of formula $Si_xH_{(2x+2)}$ wherein x is an integer of 1 or more and $R_xSiH_{(4-x)}$ wherein R is a hydrocarbon group and x is an integer of 0 to 3.

7. The method of claim 1, wherein the silane compound is at least one compound selected from the group consisting of $SiH_4$, $Si_2H_6$, and $Si_3H_8$.

8. The method of claim 1, further comprising:
    carrying out the decomposition of the Ni compound and the Si compound in the presence of a reducing agent.

9. The method of claim 8, wherein the reducing agent is hydrogen.

10. The method of claim 1, wherein the Ni compound and the silane compound are decomposed separately.

11. The method of claim 1, wherein the decomposing is carried out by exposing the Ni compound and the silane to at least one selected from the group consisting of heat, plasma, light and laser.

12. The method of claim 1, wherein the decomposing forms a conductive NiSi film.

* * * * *

UNITED STATES PATENT AND TRADEMARK OFFICE
CERTIFICATE OF CORRECTION

| | | |
|---|---|---|
| PATENT NO. | : 7,045,457 B2 | Page 1 of 1 |
| APPLICATION NO. | : 10/895871 | |
| DATED | : May 16, 2006 | |
| INVENTOR(S) | : Machida et al. | |

It is certified that error appears in the above-identified patent and that said Letters Patent is hereby corrected as shown below:

On the title page, Item (73), the Assignee information is incorrect. Item (73) should read:

-- Assignee:   Tri Chemical Laboratories Inc.,
            Kitatsuru-Gun (JP)  --

Signed and Sealed this

Eighth Day of August, 2006

JON W. DUDAS
*Director of the United States Patent and Trademark Office*